(12) United States Patent
Cho et al.

(10) Patent No.: US 7,651,923 B2
(45) Date of Patent: Jan. 26, 2010

(54) METHOD FOR FORMING TRANSISTOR OF SEMICONDUCTOR DEVICE

(75) Inventors: Young Man Cho, Icheon-si (KR); Seung Wan Kim, Seoul (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 360 days.

(21) Appl. No.: 11/730,614

(22) Filed: Apr. 3, 2007

(65) Prior Publication Data
US 2009/0011584 A1    Jan. 8, 2009

(30) Foreign Application Priority Data
Jul. 3, 2006    (KR) ...................... 10-2006-0061836

(51) Int. Cl.
*H01L 21/76*    (2006.01)
(52) U.S. Cl. ................................. 438/437; 257/E21.54
(58) Field of Classification Search ................ 438/437, 438/259, 270–272, 424; 257/E21.546, E21.547, 257/E29.262
See application file for complete search history.

(56) References Cited
U.S. PATENT DOCUMENTS
6,709,924 B1 * 3/2004 Yu et al. ..................... 438/257

FOREIGN PATENT DOCUMENTS
KR    10-2000-0044658    7/2000
KR    10-2004-0001507    1/2004
KR    10-2005-0043408    5/2005

OTHER PUBLICATIONS
Notice of Rejection mailed Jul. 21, 2008 from the Korean Intellectual Property Office for corresponding Korean Patent Application No. 10-2006-0061836.

* cited by examiner

*Primary Examiner*—W. David Coleman
*Assistant Examiner*—Daniel Shook
(74) *Attorney, Agent, or Firm*—IP & T Law Firm PLC

(57) ABSTRACT

A method for forming a transistor of a semiconductor device, includes forming a trench by etching a semiconductor substrate on which a pad oxide film and a pad nitride film are sequentially formed; forming a isolation oxide film by filling the trench with oxide; removing an upper portion of the isolation oxide film until an upper lateral portion of the semiconductor substrate is exposed; forming a barrier nitride film over the isolation oxide film, the semiconductor substrate, and the pad nitride film; forming a sacrificial oxide film over the barrier nitride film; performing a planarization process until the pad nitride film is exposed; performing a wet etching process until the active region is exposed; forming a photoresist pattern over the active region and the barrier nitride film; and performing a dry etching process by using the photoresist pattern as an etching mask, thereby forming a recessed gate trench.

8 Claims, 5 Drawing Sheets

METHOD FOR FORMING TRANSISTOR OF SEMICONDUCTOR DEVICE

RELATED APPLICATIONS

The present application claims the benefit of priority to Korean Patent Application No. 10-2006-061836, filed on Jul. 3, 2006. The entire content of this application is incorporated herein by reference.

BACKGROUND

1. Technical Field

The present invention relates to a method for forming a transistor of a semiconductor device.

2. Description of the Related Art

As semiconductor devices serve a broader range of applications, there are urgent needs associated with development of processing facilities or processing techniques for manufacturing semiconductor devices that are low in manufacturing costs yet superior in integrity and electrical properties. In relation to this, many started diversified researches on size reduction of elements, such as, reduction of thickness of a gate dielectric film and reduction of junction depth of source/drain have been researched.

However, since a semiconductor device must meet the strict design rule of 10 μm or less, in addition to the size of transistors including the aforementioned elements, length of channels of their peripheral circuits should be decreased. This makes it very difficult to manufacture transistors with stable performance.

For example, as the depletion layer of a source/drain region penetrates into a channel and reduces an effective channel length, the short channel effect has occurred. As a result, it is difficult to secure a sufficient data retention time in an element. Moreover, a junction leakage current increases because of a reduced process margin.

In order to increase the effective channel length in a conventional method, an attempt has been made to form a recessed channel gate transistor by etching an active region of a semiconductor substrate.

However, as shown in FIG. 1, in case of forming a trench for the recessed channel gate by etching the active region of a silicon substrate 1 having an isolation oxide film 3, isolation oxide film 3 can be etched deep inside during a cleansing process using phosphoric acid. As a result, an unnecessary trench having a large width is formed. Because of this, in a subsequent word line forming process, a word line pattern 5 having a vertical profile 9 is formed on the active region of semiconductor substrate 1, while a word line pattern 5-1 of a sloped sidewall 11 is formed on isolation oxide film 3 having a large width (a).

Accordingly, a bridge is formed between a storage node (or a bit-line node plug) and the word line. This brings a defect into operations of elements and further decreases productivity and yield of semiconductor devices.

SUMMARY

Embodiments of the present invention provide for a method for forming a transistor of a semiconductor device which is capable of avoiding the formation of an unnecessary recessed gate trench on an isolation oxide film region by forming a barrier nitride film over the isolation oxide film region, followed by forming a recessed gate trench.

Consistent with an embodiment of the present invention, a method for forming a transistor of a semiconductor device includes forming a trench by etching a semiconductor substrate on which a pad oxide film and a pad nitride film are sequentially formed; forming a isolation oxide film to define an active region by filling the trench with oxide; removing an upper portion of the isolation oxide film until an upper lateral portion of the semiconductor substrate is exposed; forming a barrier nitride film over the isolation oxide film, the semiconductor substrate, and the pad nitride film; forming a sacrificial oxide film over the barrier nitride film; performing a planarization process on the sacrificial oxide film and the barrier nitride film until the pad nitride film is exposed; performing a wet etching process on a resulting structure until the active region is exposed; forming a photoresist pattern over the active region and a remaining portion of the barrier nitride film; and performing a dry etching process on the active region by using the photoresist pattern as an etching mask, thereby forming a recessed gate trench.

In another embodiment consistent with the present invention, the method further includes forming a word line pattern in which a conductor layer pattern for word line and a hard mask pattern are stacked over the active region and the barrier nitride film after the formation of the recessed gate trench.

BRIEF DESCRIPTION OF THE DRAWINGS

The invention will be described in detail with reference to the following drawings in which like reference numerals refer to like elements, and wherein.

DETAILED DESCRIPTION

The present invention will be described in detail with reference to the accompanying drawings.

Figure 1:
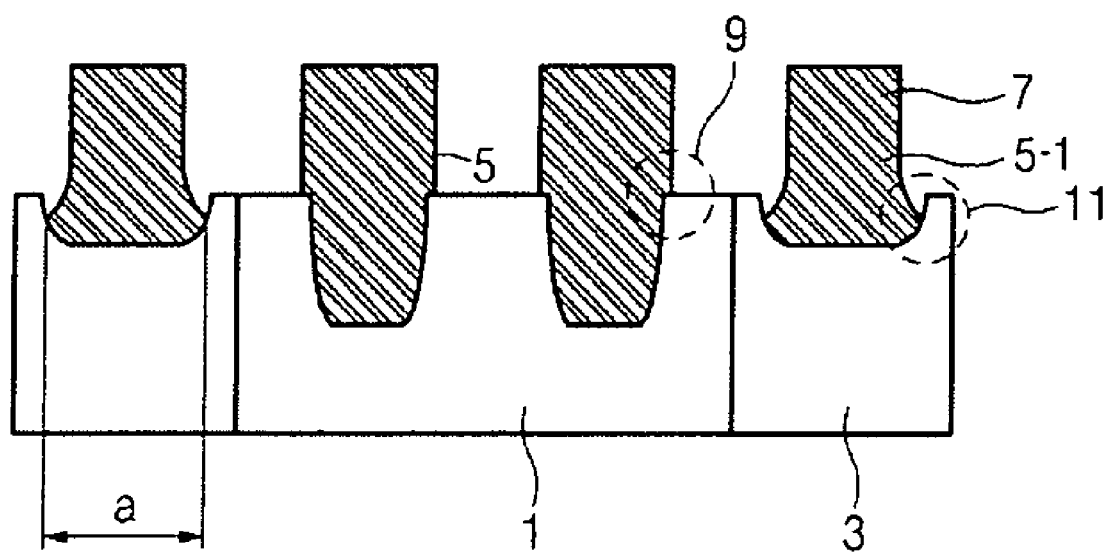
FIG. 1 is a cross-sectional view of a recessed gate obtained by a conventional method for forming a transistor.
Figure 2A:
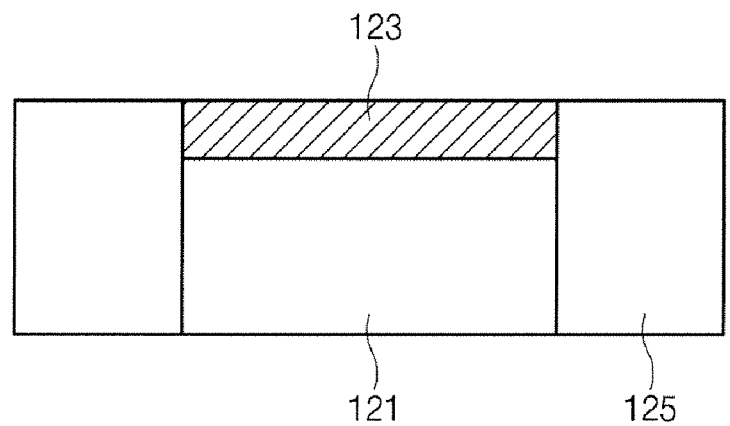
FIGS. 2a through 2g are cross-sections illustrating a method for forming a transistor consistent with an embodiment of the present invention.

FIG. 2a shows a pad oxide film (not shown) and a pad nitride film 123 sequentially deposited over a silicon substrate 121. The silicon substrate 121 is removed to a designated depth to form a trench (not shown).

The planarized oxide film is deposited over the whole resultant structure including the trench to form an isolation oxide film 125 to define an active region.

Figure 2B:
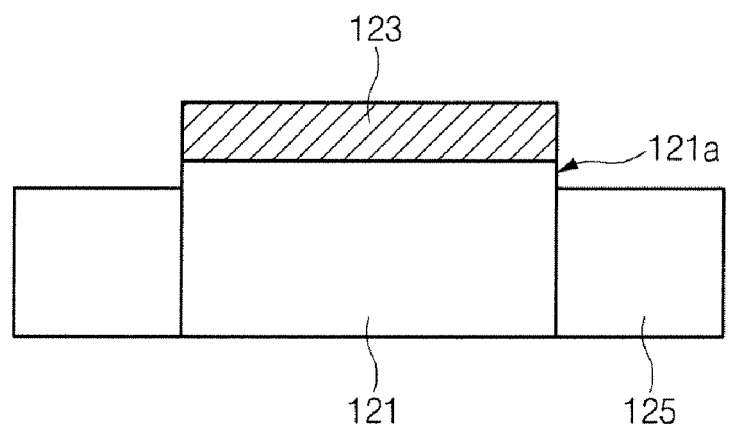

FIG. 2b shows the isolation oxide film 125 after the upper portion is removed by performing a wet or dry etch-back process on the resulting structure of the FIG. 2a until a vertical surface 121a of silicon substrate 121 is exposed into a thickness of about 500 to 1000 Å.

Figure 2C:
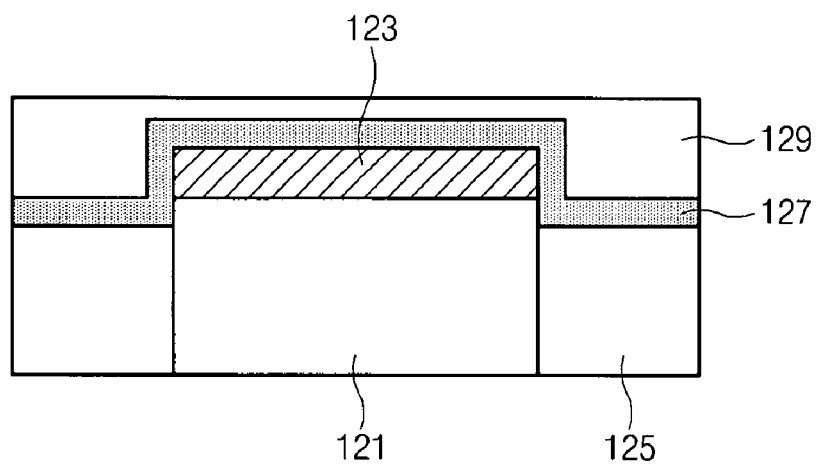

FIG. 2c shows a barrier nitride film 127 of conformal type deposited over the whole resultant structure and a sacrificial oxide film 129 deposited thereon.

Barrier nitride film 127 may be formed of a plasma enhanced (PE) nitride films or LP (Low-Pressure) nitride films, and is deposited at a thickness of about 500 to 1000 Å.

The sacrificial oxide film is used as a barrier film to control polishing of the pad nitride film without damaging the semiconductor substrate during a subsequent chemical mechanical polishing (CMP) process. The sacrificial oxide film may be selected from the group consisting of PSG (phosphosilicate glass), USG (undoped silicate glass), TEOS (tetraethoxysilicate glass), and BPSG (borophosphosilicate glass), and may be deposited at a thickness of about 3000 Å.

Figure 2D:
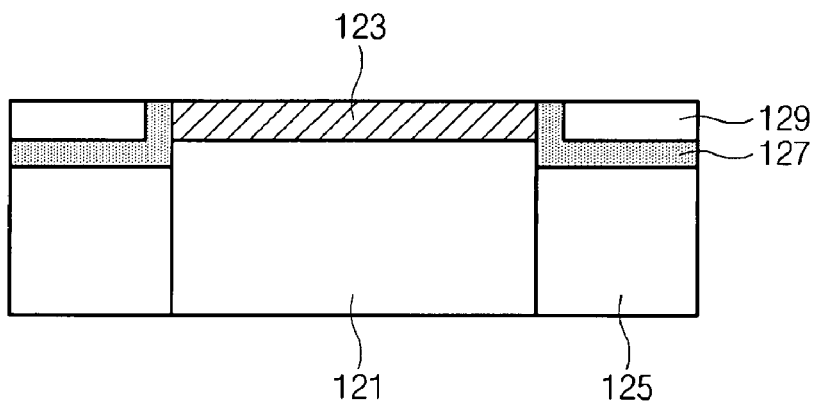

FIG. 2d shows the resultant structure obtained by performing CMP process on sacrificial oxide film 129 and barrier nitride film 127 until pad nitride film 123 is exposed.

Figure 2E:
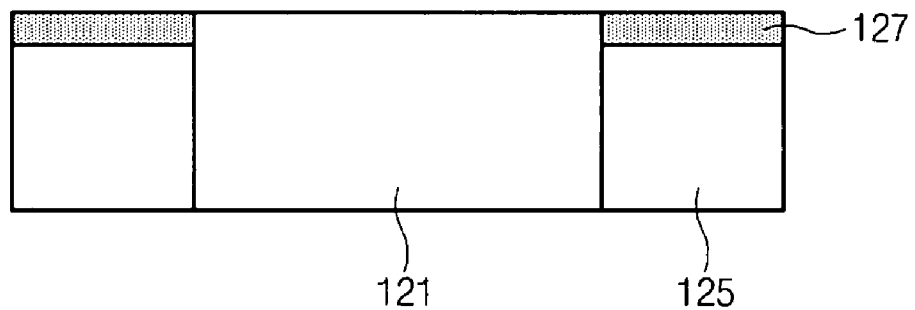

FIG. 2e shows the resultant structure obtained by performing a wet etching process on pad nitride film 123, sacrificial oxide film 129, and barrier nitride film 127 until silicon substrate 121 is exposed.

Here, the wet etching process comprises the following steps: removing pad nitride film 123 and the part of barrier nitride film 127 with phosphoric acid that is capable of removing the nitride films only; and removing sacrificial oxide film 129 by using commercial chemical for removing oxide films. The chemical for removing oxide films may be a BOE (Buffered Oxide Etchant) solution such as HF solution (HF:DI solution=1:20).

Instead of the wet etching process, the CMP process in which the semiconductor substrate is used as a polishing stop film can be used.

The resultant structure of FIG. 2e is coated with a photoresist film (not shown), and is subjected to exposure and developing processes to form photoresist pattern 131 over the resultant structure.

Figure 2F:
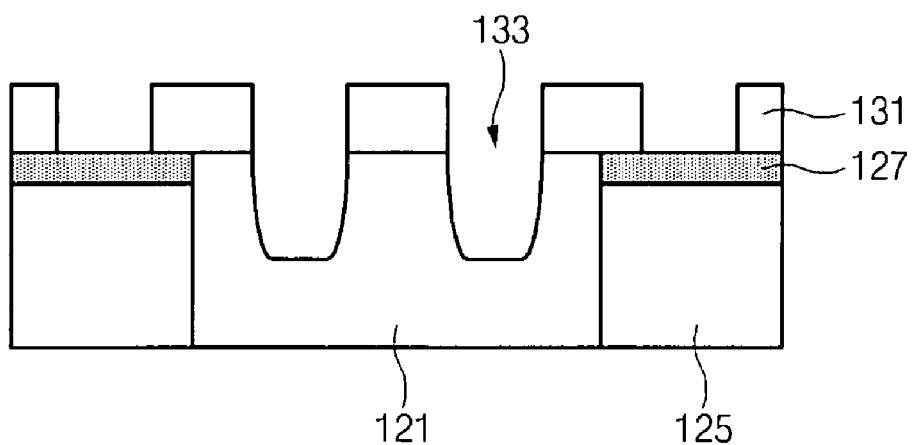

FIG. 2f shows a recessed gate trench 133 obtained by performing dry etching process with photoresist pattern 131 as an etching mask on silicon substrate 121.

Here, the dry etching process is performed under such a condition that the etch selectivity of the barrier nitride film: the silicon substrate is about 1:10 to 1:20 using an etching gas selected from the group consisting of $CF_4$, $N_2$, $O_2$, Ar, and combinations thereof. Thus, any unnecessary recessed gate trenches are not formed on isolation oxide film 125 region where barrier nitride film 127 is formed.

After photoresist pattern 131 of FIG. 2f is removed, a conductor layer (not shown) for word line and a hard mask nitride film (not shown) is sequentially deposited over barrier nitride film 127 and silicon substrate 121.

Figure 2G:
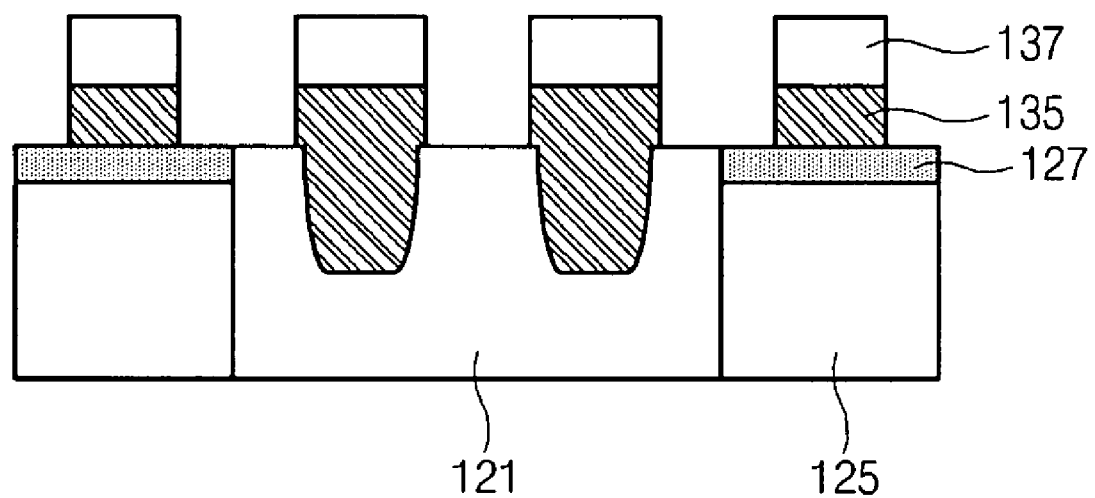

FIG. 2g shows a word line pattern having a stack structure comprising a conductor layer pattern 135 for the word line and a hard mask pattern 137 obtained by performing the etching process on the a conductor layer for the word line and a hard mask nitride film. The word line pattern formed over barrier nitride film 127 of isolation oxide film 125 region has a vertical profile.

Unlike the conventional method, the method consistent with the present invention makes it possible to avoid the formation of any unnecessary recessed gate trenches inside the isolation oxide film during the etching process for forming recessed gate trenches. As a result, during a following word line pattern forming process, a word line pattern with a vertical profile is formed over the isolation oxide film region.

In addition, the method consistent with the present invention can prevent the occurrence of malfunction due to a bridge being formed between a storage node or a bit-line node plug and the word line, thus allowing manufacturing of semiconductor devices of stable operation. Therefore, productivity and yield of semiconductor devices can be enhanced.

Although preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A method for forming a transistor of a semiconductor device, the method comprising:
    forming a trench by etching a semiconductor substrate on which a pad oxide film and a pad nitride film are sequentially formed;
    forming a isolation oxide film to define an active region by filling the trench with oxide;
    removing an upper portion of the isolation oxide film until a vertical surface of the semiconductor substrate is exposed;
    forming a barrier nitride film over the isolation oxide film, the semiconductor substrate, and the pad nitride film;
    forming a sacrificial oxide film over the barrier nitride film;
    performing a planarization process on the sacrificial oxide film and the barrier nitride film until the pad nitride film is exposed;
    performing a wet etching process on a resulting structure until the active region is exposed;
    forming a photoresist pattern over the active region and a remaining portion of the barrier nitride film; and
    performing a dry etching process on the active region by using the photoresist pattern as an etching mask, thereby forming a recessed gate trench.

2. The method according to claim 1, further comprising forming a word line pattern in which a conductor layer pattern for the word line and a hard mask pattern are stacked over the active region and the barrier nitride film after the formation of the recessed gate trench.

3. The method according to claim 1, wherein the barrier nitride film is formed of plasma enhanced (PE) nitride films or Low-Pressure (LP) nitride films.

4. The method according to claim 1, wherein the barrier nitride film is formed at a thickness of about 500 to 1000 Å.

5. The method according to claim 1, wherein the sacrificial oxide film is selected from the group consisting of PSG (phosphosilicate glass), USG (undoped silicate glass), TEOS (tetraethoxysilicate glass), and BPSG (borophosphosilicate glass).

6. The method according to claim 1, wherein the wet etching process comprises:
    removing the pad nitride film and a portion of barrier nitride film with phosphoric acid; and
    removing the sacrificial oxide film by using a chemical for removing oxide films.

7. The method according to claim 1, wherein the dry etching process is performed under such a condition that the etch selectivity of the barrier nitride film to the silicon substrate is about 1:10 to 1:20 using an etching gas selected from the group consisting of $CF_4$, $N_2$, $O_2$, Ar, and combinations thereof.

8. The method according to claim 6, wherein the chemical for removing oxide films is a BOE (Buffered Oxide Etchant) solution.

* * * * *